United States Patent
Choi

(10) Patent No.: US 8,796,051 B2
(45) Date of Patent: Aug. 5, 2014

(54) BONDING APPARATUS AND METHOD FOR DISPLAY DEVICE

(71) Applicant: Samsung Display Co., Ltd., Yongin (KR)

(72) Inventor: Deok-Jun Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/892,120

(22) Filed: May 10, 2013

(65) Prior Publication Data

US 2014/0106484 A1    Apr. 17, 2014

(30) Foreign Application Priority Data

Oct. 16, 2012  (KR) .................. 10-2012-0114825

(51) Int. Cl.
   *H01L 21/00*    (2006.01)

(52) U.S. Cl.
   USPC ........................................................... 438/26

(58) Field of Classification Search
   USPC ........................................................... 438/26
   See application file for complete search history.

(56) References Cited

U.S. PATENT DOCUMENTS

| | | | |
|---|---|---|---|
| 8,029,638 B2 * | 10/2011 | Onitsuka et al. | 156/299 |
| 2005/0011068 A1 * | 1/2005 | Yuzawa | 29/740 |
| 2006/0071325 A1 * | 4/2006 | Tanaka | 257/712 |
| 2006/0103788 A1 * | 5/2006 | Kurosawa et al. | 349/110 |
| 2006/0191631 A1 * | 8/2006 | Kojima et al. | 156/272.8 |
| 2007/0126970 A1 * | 6/2007 | Shie | 349/149 |
| 2012/0212888 A1 * | 8/2012 | Wu et al. | 361/679.01 |
| 2013/0299086 A1 * | 11/2013 | Kim et al. | 156/308.2 |

FOREIGN PATENT DOCUMENTS

| | | |
|---|---|---|
| KR | 10-0777205 B1 | 11/2007 |
| KR | 10-0962225 | 6/2010 |
| KR | 10-1040452 | 6/2011 |

OTHER PUBLICATIONS

Korean Patent Abstracts Publication No. KR10-2009-0062063 dated Jun. 17, 2009, for KR10-0962225, 2 pages.
Korean Patent Abstracts Publication No. KR10-2010-0104888 dated Sep. 29, 2010, KR10-1040452, 2 pages.

* cited by examiner

*Primary Examiner* — Karen Kusumakar
(74) *Attorney, Agent, or Firm* — Christie, Parker & Hale, LLP

(57) ABSTRACT

A bonding apparatus for a display device includes a film bonding device for bonding an anisotropic conductive film to a display substrate; and a pressure device for bonding a driving chip to the anisotropic conductive film of the display substrate, wherein the pressure device includes a pressure head with a heat source, and a pressure tip attached to a lower surface of the pressure head and including a plurality of sub-pressure tips that are separated from each other.

14 Claims, 11 Drawing Sheets

BONDING APPARATUS AND METHOD FOR DISPLAY DEVICE

CROSS-REFERENCE TO RELATED APPLICATION

This application claims priority to and the benefit of Korean Patent Application No. 10-2012-0114825 filed in the Korean Intellectual Property Office on Oct. 16, 2012, the entire contents of which are incorporated herein by reference.

BACKGROUND

1. Field

The described technology relates generally to a bonding apparatus and a method thereof for a display device.

2. Description of the Related Art

An organic light emitting diode (OLED) display includes a display substrate providing a pixel area and a non-pixel area, and an encapsulation substrate disposed to face the display substrate for encapsulation and combined to the display substrate by a sealant such as an epoxy. In the pixel area of the display substrate, a plurality of light emitting elements connected between scan lines and data lines in a matrix method thereby forming pixels are formed, and in the non-pixel area, the scan lines and the data lines of the pixel area are extended and a scan driver and a data driver processing signals provided from the outside through a pad are formed to supply the signals to the scan lines and the data lines. The scan driver and the data driver including a driving circuit processing the signals provided from the outside to generate a scan signal and a data signal may be formed in a manufacturing process of the light emitting element, or may be manufactured of a separated integrated circuit chip and may be mounted to the display substrate.

When an integrated circuit chip is manufactured and mounted to the display substrate, the integrated circuit chip may be mounted by tape automated bonding (TAB) in which the driving chip is mounted to a tape carrier package (TCP) and is connected to the pad of the display substrate, or as a chip on glass (COG) method in which the driving chip is directly attached to the pad of the display substrate. Among them, the chip on glass (COG) method has a simple structure and occupies a small area compared with the tape automated bonding method such that the chip on glass (COG) method is widely applied to a small and medium display panel of a mobile communication product.

The chip on glass (COG) method is a method in which a bump formed at an input terminal and an output terminal of the driving chip is attached to an inner lead bonding (ILB) pad and an out lead bonding (OLB) pad formed in the display substrate through a conductive ball included in an anisotropic conductive film (ACF), and a flexible printed circuit (FPC) is connected to the input pad connected to the inner lead bonding pad by a film on glass (FOG) method. Accordingly, if the control signal and the data signal are provided through a flexible printed circuit (FPC) from the outside, the driving chip generates the scan signal and the data signal, and the generated signals are transmitted to the light emitting element through the scan line and the data line connected to the out lead bonding pad.

Particularly, in the chip on glass (COG) method, the driving chip is aligned to the display substrate attached with the anisotropic conductive film (ACF), and a load is applied by using a pressure tip of a bonding apparatus for the display device to connect the bump of the driving chip to the pad of the display substrate. However, when the thickness of the display substrate is decreased and the display substrate is made of a flexible material, the display substrate is bent such that it is difficult to obtain stable pressure quality by a bonding apparatus of the conventional display device.

The above information disclosed in this Background section is only for enhancement of understanding of the background of the described technology and therefore it may contain information that does not form the prior art that is already known in this country to a person of ordinary skill in the art.

SUMMARY

Embodiments of the present invention provide a bonding apparatus for a display device and a method thereof that stably presses a driving chip when applying a chip on glass bonding process.

A bonding apparatus for a display device according to an exemplary embodiment includes: a film bonding device bonding an anisotropic conductive film to a display substrate; and a pressure device bonding a driving chip to the anisotropic conductive film of the display substrate, wherein the pressure device includes a pressure head installed with a heat source, and a pressure tip attached to a lower surface of the pressure head and including a plurality of sub-pressure tips that are separated from each other.

The plurality of sub-pressure tips may include an input pressure tip pressing an input pad of the driving chip, and an output pressure tip pressing an output pad of the driving chip.

The width of the output pressure tip may be wider than the width of the input pressure tip.

The edges of the output pressure tip and the input pressure tip may be chamfered.

A pressure connection connecting the input pressure tip and the output pressure tip may be further included.

The pressure connection, the output pressure tip, and the input pressure tip may together form a side opening of a rectangular shape.

The pressure connection, the output pressure tip, and the input pressure tip may together form a side opening of a triangular shape.

The pressure connection, the output pressure tip, and the input pressure tip may together form a side opening of an arch shape.

A plurality of sub-pressure tips may further include a side pressure tip pressing the side pad of the driving chip.

Also, a bonding method of a bonding apparatus for a display device according to an exemplary embodiment includes: attaching an anisotropic conductive film to a chip on glass bonding portion of a display substrate; positioning a driving chip on the anisotropic conductive film attached to the chip on glass bonding portion; and bonding the driving chip on the anisotropic conductive film attached to the chip on glass bonding portion by using a pressure tip of a bonding apparatus for the display device, wherein the pressure tip respectively presses a predetermined portion of the driving chip through a plurality of sub-pressure tips that are separated from each other.

The positioning of the driving chip may further include aligning the driving chip by using a first aligner formed in the display substrate and a second aligner formed in the driving chip.

The bonding of the driving chip may further include aligning the input pressure tip and the output pressure tip, and the input pad and the output pad by using the first aligner and the second aligner.

A plurality of sub-pressure tips may include an input pressure tip pressing the input pad of the driving chip, and an output pressure tip pressing the output pad of the driving chip.

A plurality of sub-pressure tips may further include a side pressure tip pressing the side pad of the driving chip.

The bonding apparatus for the display device according to an exemplary embodiment may press the input pad and the output pad of the driving chip at a small press area by using the input pressure tip and the output pressure tip that are separated from each other such that the pressure of the pressure tip is not dispersed and the input pad and the output pad may be intensively applied. Accordingly, even though the display substrate is flexible and is bent due to the small thickness, the driving chip may be stably pressed to the display substrate.

DETAILED DESCRIPTION

Figure 1:
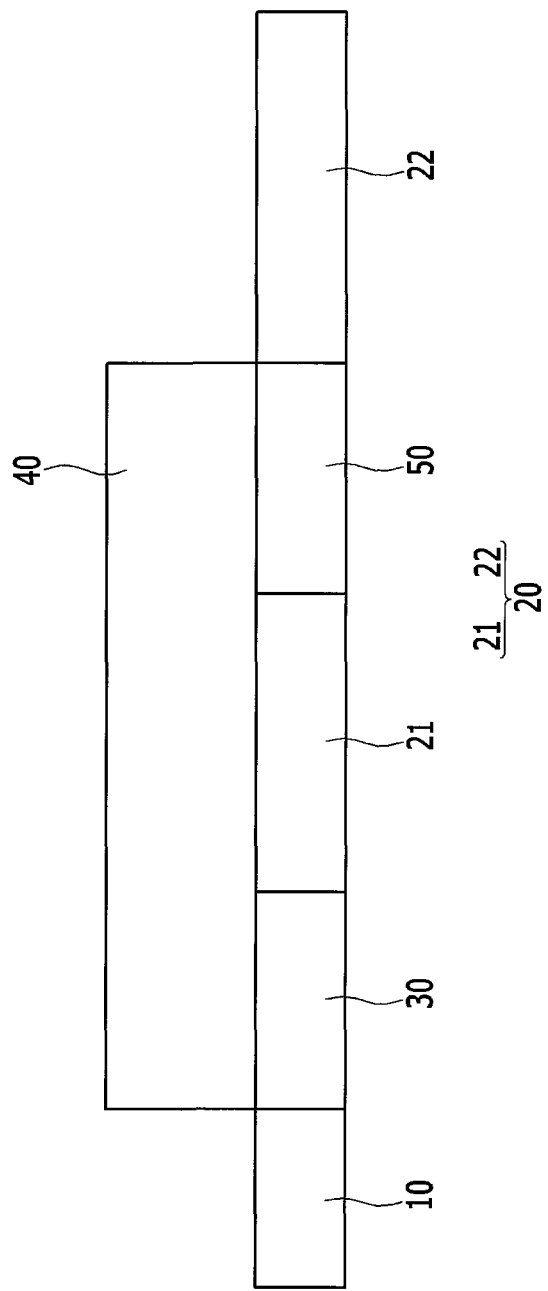
FIG. 1 is an entire schematic diagram of a bonding apparatus for a display device according to the first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In order to clarify the present invention, elements extrinsic to the description are omitted from the details of this description, and like reference numerals refer to like elements throughout the specification. The size and thickness of each component shown in the drawings are arbitrarily shown for better understanding and ease of description, and thus the present invention is not limited to those shown in the drawings.

Throughout the specification, it will be understood that when an element such as a layer, film, region, area or panel is referred to as being "on" another element, it can be directly on the other element or intervening elements may also be present.

Figure 2:
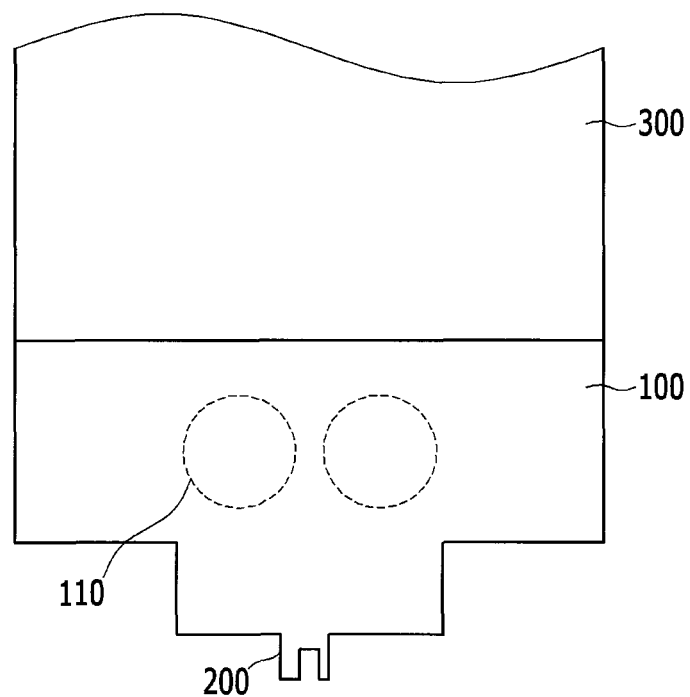
FIG. 2 is an enlarged side view of a pressure device of a bonding apparatus for a display device according to the first exemplary embodiment.
Figure 3:
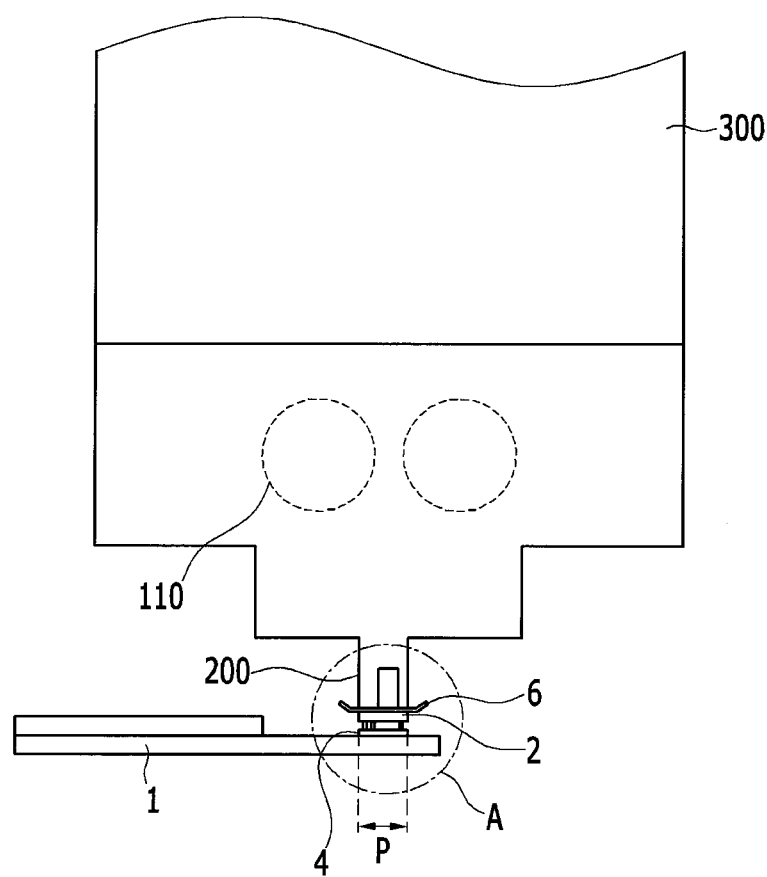
FIG. 3 is a view of a pressure state for a driving chip by using a bonding apparatus for a display device according to the first exemplary embodiment.
Figure 4:
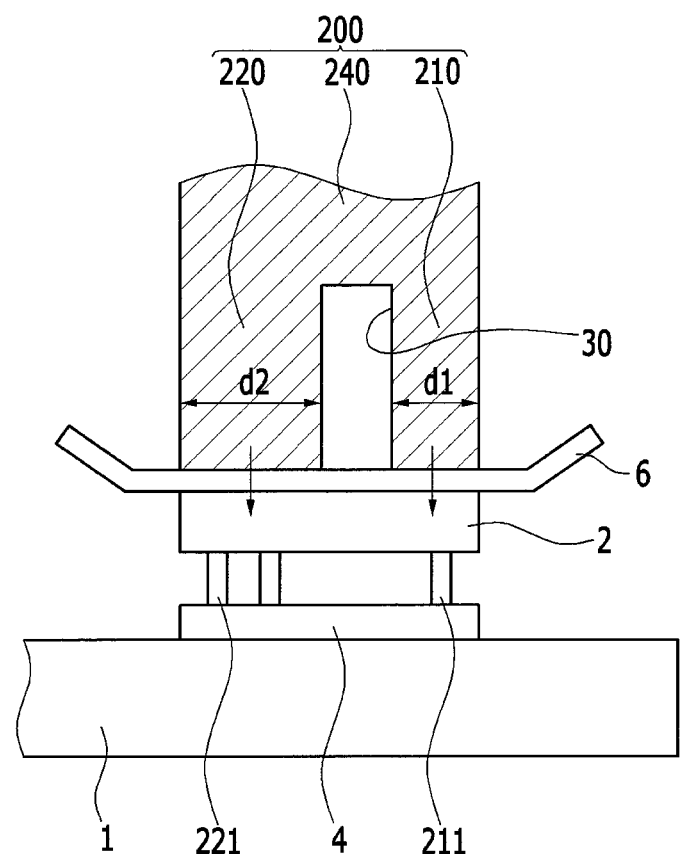
FIG. 4 is an enlarged view of a portion A of the pressure device of FIG. 3.

FIG. 1 is an entire schematic diagram of a bonding apparatus for a display device according to the first exemplary embodiment, FIG. 2 is an enlarged side view of a pressure device of a bonding apparatus for a display device according to the first exemplary embodiment, FIG. 3 is a view of a pressure state for a driving chip by using a bonding apparatus for a display device according to the first exemplary embodiment, and FIG. 4 is an enlarged view of a portion A of the pressure device of FIG. 3.

As shown in FIG. 1, the bonding apparatus for the display device according to the first exemplary embodiment includes a film bonding device 10 attaching an anisotropic conductive film 4 (referring to FIG. 3) to a display substrate 1, and a pressure device 20 bonding a driving chip 2 (referring to FIG. 3) and a flexible printed circuit (FPC) to the display substrate 1. Also, a film attaching inspector 30 inspecting whether an anisotropic conductive film 4 is attached to the display substrate 1, an anisotropic conductive film loader 40 loading the anisotropic conductive film 4, and a bonding inspector 50 inspecting whether the driving chip 2 and the flexible printed circuit (FPC) are bonded to the display substrate 1 may be further included. In addition, the pressure device 20 includes a provisional pressure device 21 performing a provisional pressure process and a main pressure device 22 performing a main pressure process.

As shown in FIG. 2, the pressure device 20 includes a pressure head 100 having a heat source 110 provided therein, a pressure tip 200 attached to a bottom surface of the pressure head 100 and pressing the driving chip 2 to the anisotropic conductive film 4 of the display substrate 1, and a transfer unit 300 attached to an upper surface of the pressure head 100 and transferring the pressure head 100.

The heat source 110 of the pressure head 100 may be a heating coil, and heat generated from the pressure source 110 is applied to the anisotropic conductive film 4 such that the driving chip 2 can be easily bonded to the chip on glass bonding portion P of the display substrate 1 through the anisotropic conductive film 4. The driving chip 2 may include an input pad 211 configured in one line, an output pad 221 configured in a plurality of lines, and a side pad 231 (referring to FIG. 6) disposed at a side.

The pressure tip 200 includes a plurality of sub-pressure tips 210 and 220 that are separated from each other, and in the first exemplary embodiment shown in FIG. 2 to FIG. 4, two sub-pressure tips are shown, however it is not limited thereto. As shown in FIG. 2 to FIG. 4, a plurality of sub-pressure tips 210 and 220 include an input pressure tip 210 pressing the input pad 211 of the driving chip 2 and an output pressure tip 220 pressing the output pad 221 of the driving chip 2.

In one embodiment, the input pad 211 includes one line and the output pad 221 includes a plurality of lines such the width d2 of the output pressure tip 220 pressing the output pad 221 may be wider than the width d1 of the input pressure tip 210 pressing the input pad 211.

The pressure tip 200 includes a pressure connection 240 connecting the input pressure tip 210 and the output pressure tip 220, and the pressure connection 240 is connected on the input pressure tip 210 and the output pressure tip 220 such that the pressure connection 240 and the output pressure tip 220 and the input pressure tip 210 may together form a side opening 30 of a rectangular shape.

Accordingly, when pressing the driving chip 2 to the anisotropic conductive film by using the pressure tip 200, the input pressure tip 210 only intensively presses the input pad 211 and the output pressure tip 220 only intensively presses the output pad 221 such that the pressure of the pressure tip 200 is not dispersed, but is intensively applied to the input pad 211 and the output pad 221. Accordingly, although the display substrate 1 is flexible and is bent due to a small thickness, the driving chip 2 may be stably pressed to the display substrate 1.

Next, a bonding method using a bonding apparatus for a display device according to the first exemplary embodiment will be described in detail with reference to FIG. 5, FIG. 6, and FIG. 4.

Figure 5:
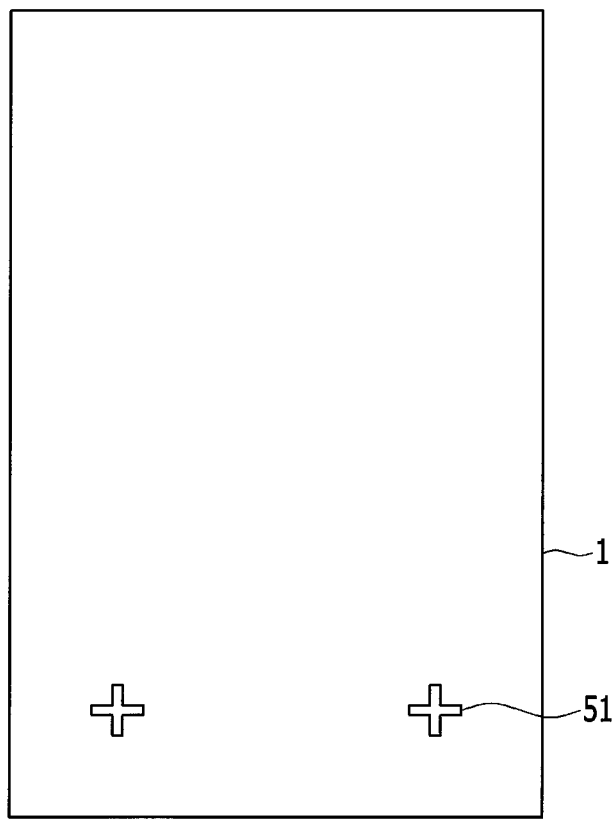
FIG. 5 is a view of a first aligner used in a bonding method using a bonding apparatus for a display device according to the first exemplary embodiment.
Figure 6:
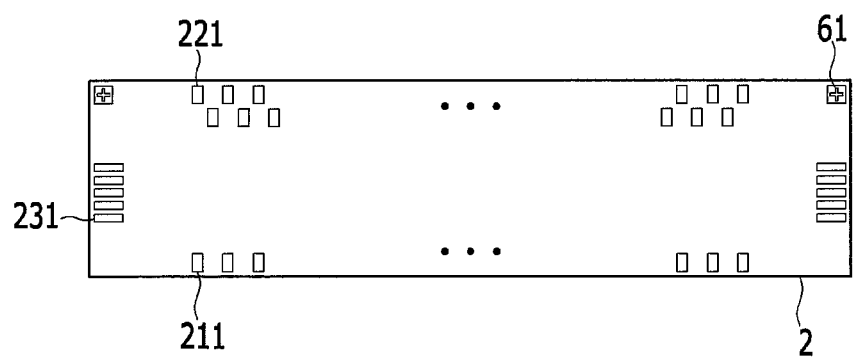
FIG. 6 is a view of a second aligner used in a bonding method using a bonding apparatus for a display device according to the first exemplary embodiment.

FIG. 5 is a view of the first aligner used in a bonding method using a bonding apparatus for a display device according to the first exemplary embodiment, and FIG. 6 is a view of the second aligner used in a bonding method using a bonding apparatus for a display device according to the first exemplary embodiment.

Firstly, the anisotropic conductive film 4 is attached to a chip on glass bonding portion P of the display substrate 1 by using the film bonding device 10. The anisotropic conductive film 4 is formed of a double-sided adhesive tape formed by mixing a polymer cured by heat and fine conductive particles in a dispersed manner. Thus, when pressure is applied from upper and lower portions of the anisotropic conductive film 4, the conductive particles are exploded and thus the polymer in the particles is wholly filled in the double-sided adhesive tape, thereby achieving conductivity and adherence. The conductive particles may include a metal such as carbon fiber, nickel (Ni), platinum (Pt), and the like, or an alloy thereof, and the polymer may include styrene butadiene rubber, polyvinyl, butylene, epoxy resin, polyurethane, and acrylic resin.

Next, a driving chip 2 is positioned on the anisotropic conductive film 4 attached to the chip on glass bonding portion P of the display substrate 1. At this time, as shown in FIG. 5 and FIG. 6, the driving chip 2 is aligned by using a first aligner 51 formed in the display substrate 1 and a second aligner 61 formed in the driving chip 2.

Next, the driving chip 2 is bonded on the anisotropic conductive film 4 attached to the chip on glass bonding portion P of the display substrate 1 by using the pressure tip 200. Then, the pressure tip 200 is divided into the input pressure tip 210 pressing the input pad 211 of the driving chip 2 and the output pressure tip 220 pressing the output pad 221 of the driving chip 2 such that the input pressure tip 210 only intensively presses the input pad 211 and the output pressure tip 220 only intensively presses the output pad 221, and thereby the pressure of the pressure tip 200 is not dispersed, but is intensively applied to the input pad 211 and the output pad 221. Accordingly, although the display substrate 1 is flexible and is bent due to a small thickness, the driving chip 2 may be stably pressed to the display substrate 1.

At this time, the input pressure tip 210 and the output pressure tip 220 of the pressure tip 200 and the input pad 211 and the output pad 221 of the driving chip 2 are respectively aligned by using the first aligner 51 and the second aligner 61. Accordingly, the pressure of the pressure tip 200 is not dispersed, but is intensively applied to the input pad 211 and the output pad 221.

Also, heat of a high temperature of the pressure tip 200 and a physical impact are directly transmitted to the driving chip 2 such that the driving chip 2 may be damaged, but to prevent this damage, a protection plate 6 may be positioned between the driving chip 2 and the pressure tip 200.

In the first exemplary embodiment, the edges of the input pressure tip 210 and the output pressure tip 220 directly contact the driving chip. However a second exemplary embodiment in which the edges of the output pressure tip and the input pressure tip are chamfered to not directly contact the driving chip is possible.

Next, the second exemplary embodiment will be described in detail with reference to FIG. 7.

Figure 7:
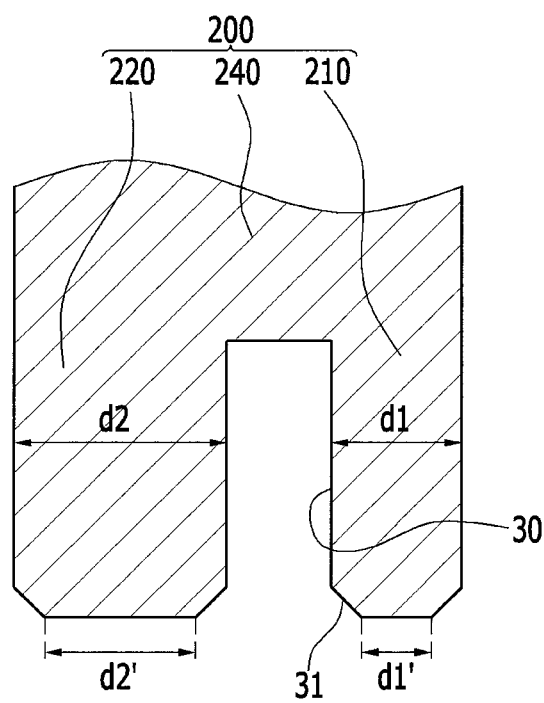
FIG. 7 is an enlarged side view of a pressure tip of a bonding apparatus for a display device according to the second exemplary embodiment.

FIG. 7 is an enlarged side view of a pressure tip of a bonding apparatus for a display device according to the second exemplary embodiment.

The second exemplary embodiment is FIG. 7 is substantially equivalent to the first exemplary embodiment shown in FIG. 1 to FIG. 4 except for the output pressure tip and the input pressure tip having the chamfered edge such that repeated description is omitted.

As shown in FIG. 7, the edges of the output pressure tip 220 and the input pressure tip 210 of the pressure tip 200 of the bonding apparatus for the display device according to the second exemplary embodiment are chamfered (element number 31). Accordingly, the width d2' under the output pressure tip 220 is smaller than the width d2 of the output pressure tip, and the width d1' under the input pressure tip 210 is smaller than the width d1 of the input pressure tip 210.

Accordingly, the input pressure tip 210 and the output pressure tip 220 may press the input pad 211 and the output pad 221 of the driving chip 2 by the further small area such that the pressure of the pressure tip 200 is not dispersed and may intensively press the input pad 211 and the output pad 221. Accordingly, although the display substrate 1 is flexible and is bent due to a small thickness, the driving chip 2 may be stably pressed to the display substrate 1.

Additionally, the pressure connection, and the output pressure tip and the input pressure tip, may together form the side opening of the rectangular shape in the first exemplary embodiment, however a third exemplary embodiment or a fourth exemplary embodiment in which the pressure connection, and the output pressure tip and the input pressure tip, together form the side opening of a triangular shape or an arch shape is possible.

Next, the third exemplary embodiment and the fourth exemplary embodiment will be described with reference to FIG. 8 and FIG. 9.

Figure 8:
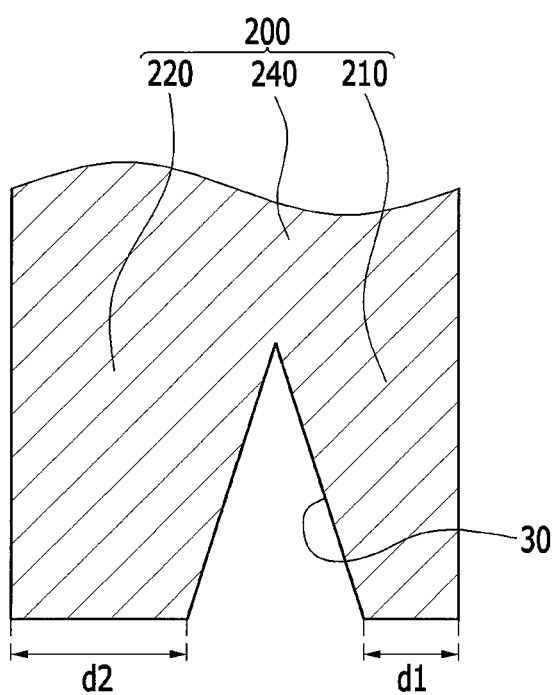
FIG. 8 is an enlarged side view of a pressure tip of a bonding apparatus for a display device according to the third exemplary embodiment.
Figure 9:
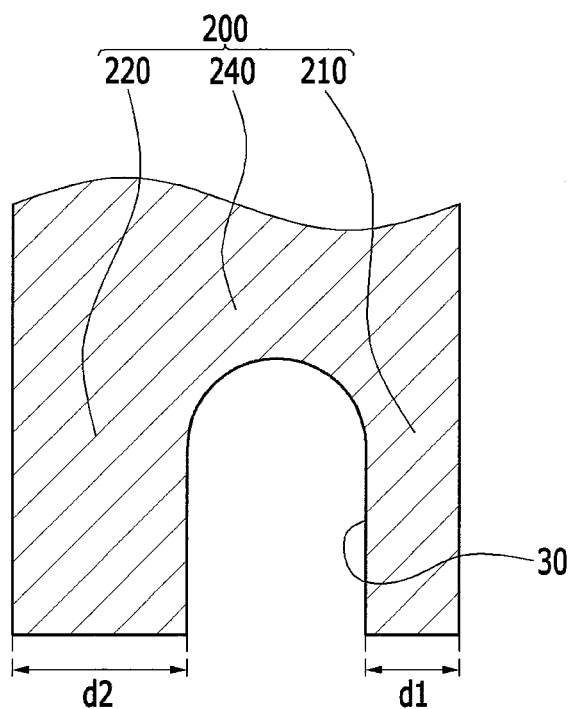
FIG. 9 is an enlarged side view of a pressure tip of a bonding apparatus for a display device according to the fourth exemplary embodiment.

FIG. 8 is an enlarged side view of a pressure tip of a bonding apparatus for a display device according to the third exemplary embodiment, and FIG. 9 is an enlarged side view of a pressure tip of a bonding apparatus for a display device according to the fourth exemplary embodiment.

The third exemplary embodiment shown in FIG. 8 and the fourth exemplary embodiment shown in FIG. 9 is substantially equivalent to the first exemplary embodiment shown FIG. 1 to FIG. 4 except for the shape of the side opening such that repeated description is omitted.

As shown in FIG. 8, the pressure tip 200 of the bonding apparatus for the display device according to the third exemplary embodiment includes the input pressure tip 210 pressing the input pad 211 of the driving chip 2, the output pressure tip 220 pressing the output pad 221 of the driving chip 2, and the pressure connection 240 connecting the input pressure tip 210 and the output pressure tip 220. The widths d1 and d2 of the input pressure tip 210 and the output pressure tip 220 are decreased from an upper side to a lower side such that the pressure connection 240, and the output pressure tip 220 and the input pressure tip 210, together form the side opening 30 of a triangular shape.

Accordingly, the input pressure tip 210 and the output pressure tip 220 may press the input pad 211 and the output pad 221 of the driving chip 2 by the further small area such that the pressure of the pressure tip 200 is not dispersed and may intensively press the input pad 211 and the output pad 221.

Also, as shown in FIG. 9, the pressure tip 200 of the bonding apparatus for the display device according to the third exemplary embodiment includes the input pressure tip 210 pressing the input pad 211 of the driving chip 2, the output pressure tip 220 pressing the output pad 221 of the driving chip 2, and the pressure connection 240 connecting the input pressure tip 210 and the output pressure tip 220. The widths d1 and d2 of the input pressure tip 210 and the output pressure tip 220 are decreased from the upper side to the lower side such that the pressure connection 240, and the output pressure tip 220 and the input pressure tip 210, together form the side opening 30 of the arch shape. Accordingly, the input pressure tip 210 and the output pressure tip 220 may press the input pad 211 and the output pad 221 of the driving chip 2 by the further small area such that the pressure of the pressure tip 200 is not dispersed and may intensively press the input pad 211 and the output pad 221.

The pressure tip of the first exemplary embodiment may include the output pressure tip and the input pressure tip, however a fifth exemplary embodiment further including other types of pressure tips or configurations is also possible.

Next, the fifth exemplary embodiment will be described with reference to FIG. 10 and FIG. 11.

Figure 10:
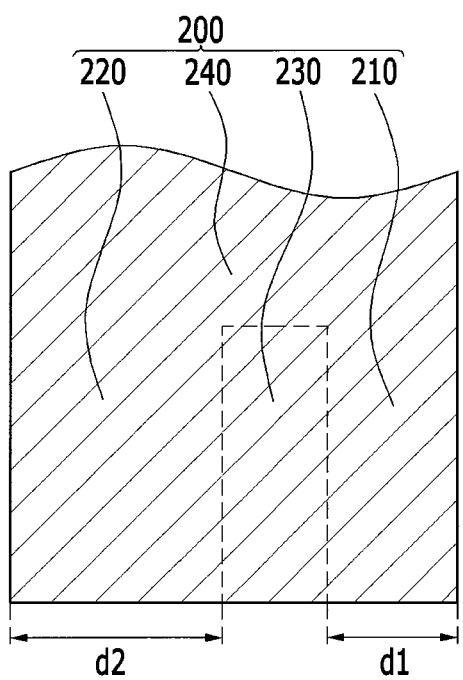
FIG. 10 is an enlarged side view of a pressure tip of a bonding apparatus for a display device according to the fifth exemplary embodiment.
Figure 11:
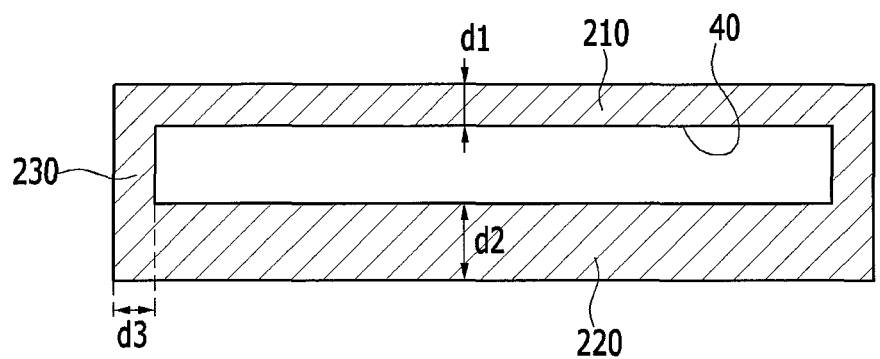
FIG. 11 is an enlarged bottom view of a pressure tip of a bonding apparatus for a display device according to the fifth exemplary embodiment.

FIG. 10 is an enlarged side view of a pressure tip of a bonding apparatus for a display device according to the fifth exemplary embodiment, and FIG. 11 is an enlarged bottom view of a pressure tip of a bonding apparatus for a display device according to the fifth exemplary embodiment.

The fifth exemplary embodiment shown in FIG. 10 and FIG. 11 is substantially equivalent to the first exemplary embodiment shown in FIG. 1 to FIG. 4 except for the side pressure tip.

As shown in FIG. 10 and FIG. 11, the pressure tip 200 of the bonding apparatus of the display device according to the fifth exemplary embodiment includes the input pressure tip 210 pressing the input pad 211 of the driving chip 2, the output pressure tip 220 pressing the output pad 221 of the driving chip 2, a side pressure tip 230 pressing the side pad 231 of the driving chip 2, and a pressure connection 240 connecting an upper portion of the input pressure tip 210, an upper portion of the output pressure tip 220, and an upper portion of the side pressure tip 230.

The sides of the input pressure tip 210, the output pressure tip 220, and the side pressure tip 230 are connected to each other such that a pressure groove 40 enclosed by the input pressure tip 210, the output pressure tip 220, and the side pressure tip 230 is formed.

The side pad 231 of the driving chip 2 is configured in one line such that the width d2 of the output pressure tip 220 pressing the output pad 221 configured in a plurality of lines may be larger than the width d3 of the side pressure tip 230.

As described above, the pressure tip 200 may respectively press the input pad 211, the output pad 221, and the side pad 231 of the driving chip 2 through the input pressure tip 210, the output pressure tip 220, and the side pressure tip 230 that are separated at the lower side such that the pressure of the pressure tip 200 is not dispersed and may be intensively applied to the input pad 211, the output pad 221, and the side pad 231.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| 1: | display substrate | 2: | driving chip |
|---|---|---|---|
| 4: | anisotropic conductive film | 20: | pressure device |
| 100: | pressure head | 200: | pressure tip |
| 210: | input pressure tip | 220: | output pressure tip |
| 230: | side pressure tip | 240: | pressure connection |

What is claimed is:

1. A bonding apparatus for a display device, the bonding apparatus comprising:
a film bonding device for bonding an anisotropic conductive film to a display substrate; and
a pressure device for bonding a driving chip to the anisotropic conductive film of the display substrate,
wherein the pressure device comprises:
a pressure head with a heat source, and
a pressure tip attached to a lower surface of the pressure head and including a plurality of sub-pressure tips that are separated from each other.

2. The bonding apparatus of claim 1, wherein the plurality of sub-pressure tips comprise:
an input pressure tip configured to press an input pad of the driving chip; and
an output pressure tip configured to press an output pad of the driving chip.

3. The bonding apparatus of claim 2, wherein a width of the output pressure tip is wider than a width of the input pressure tip.

4. The bonding apparatus of claim 3, wherein edges of the output pressure tip and the input pressure tip are chamfered.

5. The bonding apparatus of claim 3, further comprising a pressure connection connecting the input pressure tip and the output pressure tip.

6. The bonding apparatus of claim 5, wherein the pressure connection, the output pressure tip, and the input pressure tip together form a side opening of a rectangular shape.

7. The bonding apparatus of claim 5, wherein the pressure connection, the output pressure tip, and the input pressure tip together form a side opening of a triangular shape.

8. The bonding apparatus of claim 5, wherein the pressure connection, the output pressure tip, and the input pressure tip together form a side opening of an arch shape.

9. The bonding apparatus of claim 5, wherein the plurality of sub-pressure tips further include a side pressure tip pressing the side pad of the driving chip.

10. A bonding method of a bonding apparatus for a display device, the method comprising:
attaching an anisotropic conductive film to a chip on glass bonding portion of a display substrate;
positioning a driving chip on the anisotropic conductive film attached to the chip on glass bonding portion; and
bonding the driving chip on the anisotropic conductive film attached to the chip on glass bonding portion by using a pressure tip of a bonding apparatus for the display device,
wherein the pressure tip respectively presses a portion of the driving chip through a plurality of sub-pressure tips that are separated from each other.

11. The bonding method of claim 10, wherein the positioning of the driving chip further comprises aligning the driving chip by using a first aligner formed in the display substrate and a second aligner formed in the driving chip.

12. The bonding method of claim 11, wherein the bonding of the driving chip further comprises aligning an input pressure tip and an output pressure tip and an input pad and an output pad by using the first aligner and the second aligner, respectively.

13. The bonding method of claim 11, wherein the plurality of sub-pressure tips comprise an input pressure tip pressing an input pad of the driving chip and an output pressure tip pressing an output pad of the driving chip.

14. The bonding method of claim 13, wherein the plurality of sub-pressure tips further include a side pressure tip pressing the side pad of the driving chip.

\* \* \* \* \*